United States Patent [19]

Bercy

[11] Patent Number: 4,721,863

[45] Date of Patent: Jan. 26, 1988

[54] CIRCUIT FOR PROVIDING DC ISOLATION BETWEEN A PULSE GENERATOR AND A LOAD

[75] Inventor: Oséas Bercy, Verrieres le Buisson, France

[73] Assignee: U.S. Philips Corporation, New York, N.Y.

[21] Appl. No.: 739,356

[22] Filed: May 30, 1985

[30] Foreign Application Priority Data

Jun. 15, 1984 [FR] France ................................ 84 09410

[51] Int. Cl.4 ................................................ H03K 5/00

[52] U.S. Cl. ....................................... 307/89; 307/106; 307/107; 363/124

[58] Field of Search ...................... 307/89, 90, 91, 106, 307/107, 146; 363/124

[56] References Cited

U.S. PATENT DOCUMENTS

| | | | |
|---|---|---|---|
| 2,758,206 | 8/1956 | Hamilton | 307/107 X |
| 2,787,755 | 4/1957 | Smith | 307/107 X |
| 2,942,175 | 6/1960 | Wright | 307/106 X |
| 3,234,407 | 2/1966 | Einhorn et al. | 307/107 X |
| 3,339,022 | 8/1967 | Abramson et al. | 307/89 X |
| 3,375,378 | 3/1968 | Vandemore et al. | 307/107 |
| 3,524,071 | 8/1970 | Kintzinger et al. | 307/107 X |
| 3,681,656 | 8/1972 | Mitchell | 307/107 X |
| 4,612,455 | 9/1986 | Weiner et al. | 307/106 X |

FOREIGN PATENT DOCUMENTS

| | | | |
|---|---|---|---|
| 57-154931 | 9/1982 | Japan | 307/106 |
| 1252905 | 11/1971 | United Kingdom | 307/106 |
| 2135547 | 8/1984 | United Kingdom | 307/106 |

*Primary Examiner*—Bentsu Ro

*Attorney, Agent, or Firm*—Thomas A. Briody; Jack Oisher; William J. Streeter

[57] ABSTRACT

A circuit for providing a DC isolation between a pulse generator (E) and a load (CH) of the kind comprising a primary circuit (2), a secondary circuit (4) and at least one magnetization current elimination circuit (12) on the secondary side, characterized in that it is provided on the primary side with at least one unidirectional transmission circuit (15) which causes the pulses to pass and causes the magnetization current forcibly to be dissipated through the secondary in the circuit (12) for eliminating the said magnetization current and with at least one circuit (18) for attenuating the transient phenomena due to the commutation thus protecting the pulse generator (E).

4 Claims, 3 Drawing Figures

CIRCUIT FOR PROVIDING DC ISOLATION BETWEEN A PULSE GENERATOR AND A LOAD

The invention relates to an electrical circuit for providing DC isolation between a pulse generator and a load of the kind comprising a primary circuit and a secondary circuit coupled to each other by mutual inductance with at least one magnetization current elimination circuit being connected to the secondary circuit.

Such an circuit is known from German Pat. No. 1,236,566 and is entirely satisfactory when the pulse generator cyclically has a high impedance, especially when occurring at the output of a transistor in the commutation mode. When the generator transmits a series of pulses for the same sign (for example positive pulses), the magnetization current tends to increase by a phenomenon of accumulation in time if it is not sufficiently dissipated. The characteristics of the transformer then degrade as the magnetization current increases. The material of the core becomes saturated and the transformer no longer transmits the pulses. When a magnetization current elimination circuit is connected to the secondary of the transformer and parallel to the load, the disadvantages resulting from the saturation are avoided.

However, if the pulse generator continually has a low impedance, as is the case, for example, with an operational amplifier, another disadvantage appears. The primary of the transformer then chooses the shortest path of lowest resistance for dissipating the magnetization current, which returns to the generator, thus leading to disturbances and destruction.

The invention provides an circuit which is an improvement of the aforementioned German Patent filed by Philips, in which the aforementioned disadvantage is avoided when the pulse generator continually has a low output impedance. Such an circuit can then be connected to the output of a generator of an arbitrary type without other precautions.

SUMMARY OF THE INVENTION

The circuit for providing DC isolation between a pulse generator and a load comprises at least one unidirectional transmission circuit which is connected between the pulse generator and the primary circuit. The pulses in cooperation with the magnetization current elimination circuit cause said magnetization current to be dissipated rapidly and solely through the secondary.

According to a preferred embodiment of the invention, the unidirectional transmission circuit is constituted by a diode connected in series with the primary circuit. The diode causes the pulses to pass to the primary circuit and has a high impedance to the magnetization current that tends to return to the generator. Thus, it masks the low impedance of the latter.

According to another embodiment of the invention, the circuit moreover comprises at least one circuit for attenuating transient phenomena due to the commutation. This is constituted preferably by a Zener diode connected in series with the unidirectional transmission circuit. The pulse generator is subjected to frequent transitions during the emission of a message (for example, a message encoded in "Return-to-Zero", RZ). At each transition there are produced parasitic fluctuations or parasitic noise signals designated as transient phenomena. The Zener diode consequently smoothes these parasitic noise signals, advantageously attenuates the transient phenomena due to the commutation and immunizes the transmission of the signals.

In order that the invention may be readily carried out, it will now be described more fully, by way of example, with reference to the accompanying Figures.

DESCRIPTION OF THE PREFERRED EMBODIMENT

Figure 1:
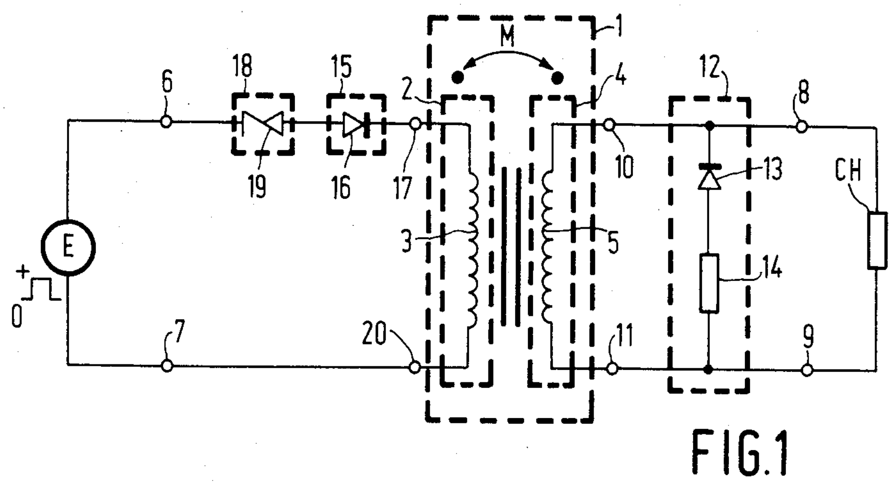
FIG. 1 shows a complete circuit according to the invention.

In FIG. 1, the circuit is constituted by a transformer 1 comprising a primary circuit 2 having a single winding 3 and a secondary circuit 4 also having a single winding 5, the primary circuit 2 and the secondary circuit 4 being coupled to each other by mutual inductance M. The winding 5 of the secondary circuit 4 and the winding 3 of the primary circuit 3 are wound so that the pulses returning with a given polarity (for example positive pulses) at the winding 3 leave again the winding 5 with the same polarity. The transformer 1 provides a DC isolation and transmits the signal of the generator E connected at the input between the terminals 6 and 7 and supplying pulses of positive polarity to the load CH connected between the points 8 and 9. The terminals 10 and 11 of the secondary circuit 4 have connected to them a series circuit 12 designated as magnetization current elimination circuit, which is composed of a diode 13 and a resistor 14. One side of the resistor 14 is connected on the one hand to the terminal 11 of the secondary circuit 4 and on the other hand to the point 9, thus connecting it to one side of the load CH. The other side of the resistor 14 is connected to the anode of the diode 13. The cathode of the diode 13 is connected on the one hand to the terminal 10 of the secondary circuit 4 and on the other hand to the point 8 and is thus connected to the other side of the load CH. The diode 13 conducts the magnetization current, which is consequently dissipated in the resistor 14, if the pulse generator E has a high impedance during this time.

According to the invention, a unidirectional transmission circuit 15, which is connected between the pulse generator E and the primary circuit 2, causes the pulses to pass and in cooperation with the magnetization current elimination circuit 12 forces said magnetization current to be dissipated rapidly and solely through the secondary circuit 4. The unidirectional transmission circuit 15 is constituted preferably by a diode 16 connected in series with the primary circuit 2 of the transformer 1. The cathode of the diode 16 is connected to the primary circuit 2 at the terminal 17.

According to a preferred embodiment of the invention, a circuit 18 for attenuating the transient phenomena due to the commutation is arranged upstream of the unidirectional transmission circuit 15 and in series with the latter. This attenuation circuit is preferably constituted by a Zener diode 19. The anode of the Zener diode 19 is connected to the anode of the diode 16. The cathode of the Zener diode 19 is connected to the input terminal 6 and is thus connected to a point of the pulse generator E. The terminal 20 of the primary circuit 2 is directly connected to the second input terminal 7, which in turn is connected to the pulse generator E at its second point.

The diode 16 causes the pulses of positive polarity to pass and inhibits the magnetization current to return because it has in inverse direction a high impedance. It causes the magnetization current to be dissipated through the secondary circuit 4 in the magnetization current elimination circuit 12 specially provided for this purpose.

On the other hand, the pulse generator E is subjected to frequent transitions and is therefore disturbed by transient phenomena due to the commutation. The function of the Zener diode 19 is to advantageously attenuate the influence of the transient phenomena due to the commutation. It smoothes the parasitic fluctuations and immunizes the transmission of the signals.

Figure 2:
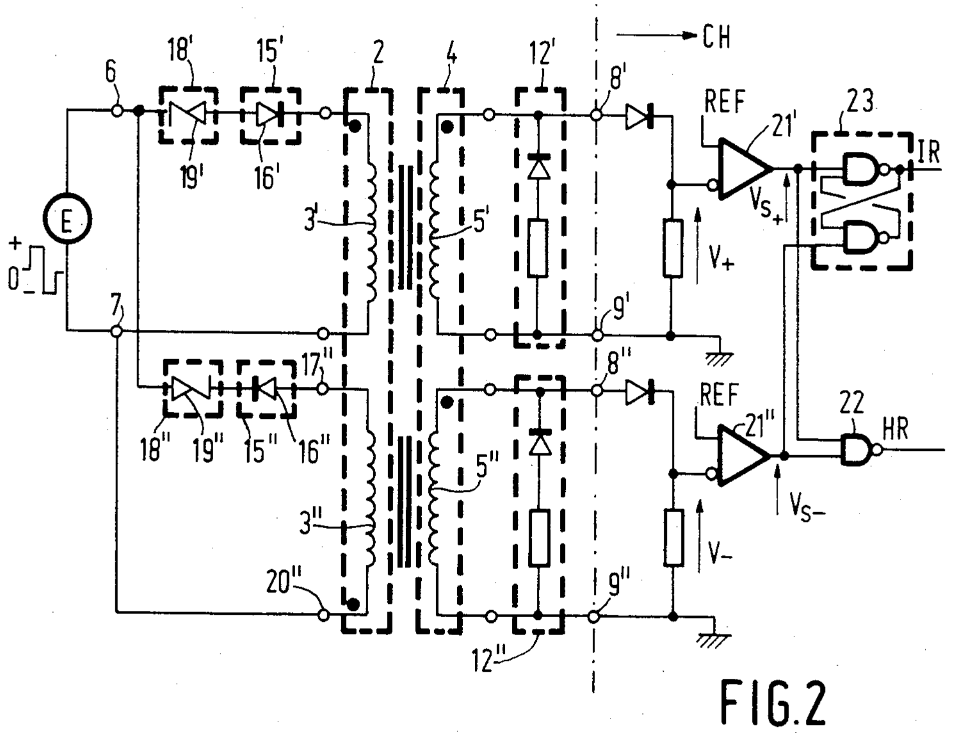
FIG. 2 shows another circuit according to the invention for a generator supplying bipolar pulses.
Figure 3:
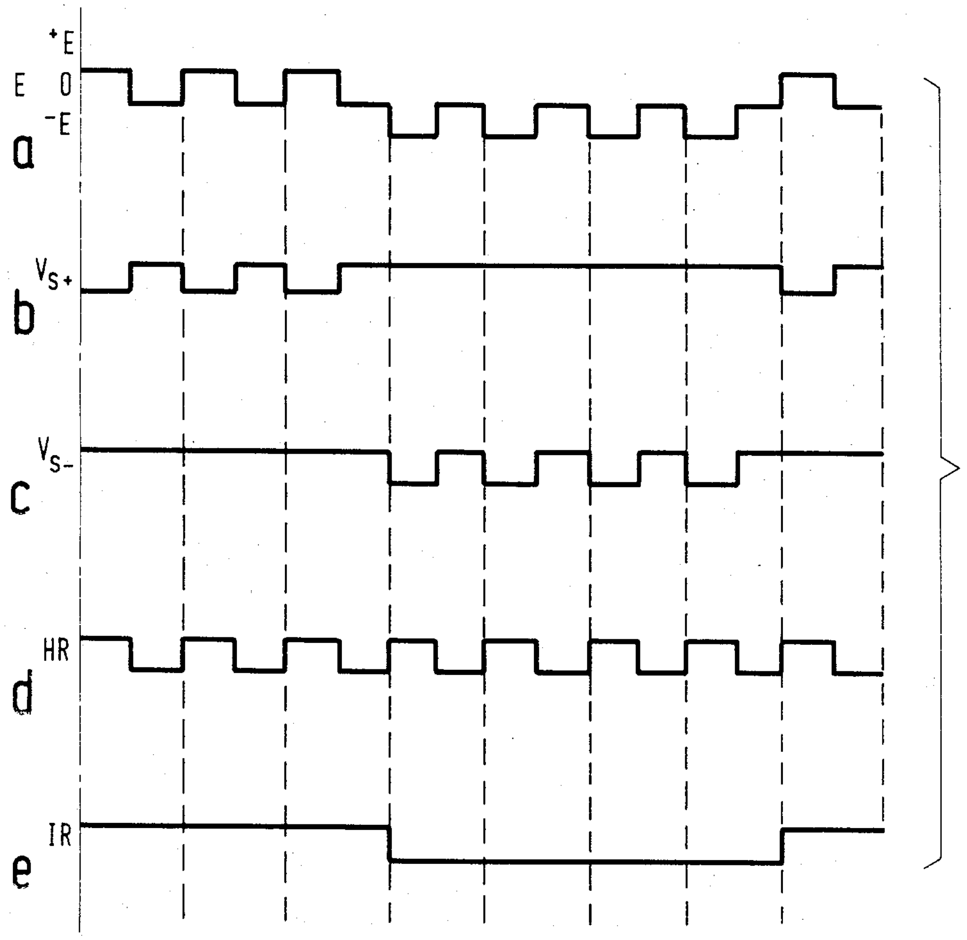
FIG. 3 shows the form of some signals in the circuit shown in FIG. 2.

In FIG. 2 there is illustrated another circuit according to the invention, for which the pulse generator E supplies pulses of the bipolar type, such as represented in FIG. 3*a*.

The primary circuit 2 comprises two windings 3' and 3" each admitting one polarity of the pulses. Similarly, the secondary circuit 4 comprises two windings 5' and 5" transmitting the pulses to a load CH. The winding 5' of the secondary circuit 4 and the winding 3' of the primary circuit 3 are wound so that the pulses returning with a given polarity (for example a positive polarity) at the winding 3' leave again the winding 5' with the same polarity. On the contrary, the winding 5" of the secondary circuit 4 and the winding 3" of the primary circuit 2 are wound so that the pulses returning with a given polarity (for example a negative polarity) at the winding 3" leave again the winding 5" with an opposite (positive) polarity.

The pulses of positive polarity are routed by means of the unidirectional transmission circuit 15' and are transmitted by the winding 3' of the primary circuit 2. The pulses of negative polarity are routed by means of the unidirectional transmission circuit 15" to the winding 3" of the primary circuit 2. The circuits 18' and 18" for attenuating the transient phenomena due to the commutation are connected in series with the unidirectional transmission circuits 15' and 15" respectively.

The unidirectional transmission circuits and the circuits for attenuating the transient phenomena due to the commutation are each adapted to the polarities of the pulses.

The operation of the circuit shown is quite identical to the operation described for the circuit of FIG. 1, except for the fact that in the unidirectional transmission circuit 15" and the circuit 18" for attenuating the transient phenomena due to the commutation, the diode 16" and the Zener diode 19" are corrected in a sense inverse to the connection of the diode 16 and the Zener diode 19 in order that the pulses are routed and only the pulses of negative polarity are caused to pass.

The diode 16' in series with the winding 3' of the primary circuit allows only the pulses of positive polarity to pass, while the diode 16" in series with the winding 3" of the primary circuit 2 only allows the pulses of negative polarity to pass. The diodes 16' and 16" inhibit return of the magnetization current to the pulse generator E.

The Zener diode 19' is connected in series with the diode 16', while the Zener diode 19" is connected in series with the diode 16". The Zener diodes 19' and 19" protect the pulse generator E by smoothing the parasitic fluctuations, thus attenuating the transient phenomena due to the commutation.

The diodes 16' and 19' are connected in the same manner as the diodes 16 and 19 of FIG. 1 because they all receive pulses of positive polarity.

The cathodes of the diodes 16" and 19" are connected to each other. The anode of the diode 16" is connected to the point 17" of the primary circuit 2. The anode of the diode 19" is connected at the input to the terminal 6 and is thus connected to a point of the pulse generator E. The primary circuit 2 is connected by its terminal 20" to the second point of the pulse generator E by means of the terminal 7.

The magnetization current elimination circuits 12' and 12" are quite identical to the circuit 12 of FIG. 1 as to the operation and the positioning of the elements.

A load CH is connected to the points 8' and 9', the voltage $V_+$ being the voltage at the terminals of this load. An equivalent load is connected to the points 8" and 9", the voltage $V_-$ being the voltage at the terminals of this second load. The voltage $V_+$ is applied to the inverting input of a voltage comparator circuit 21'. It is compared with a reference voltage REF, which is a fraction of the amplitude of the input voltage. Thus, the transitions of $V_+$ are detected. The output voltage $V_{S+}$ is present at the output of the voltage comparator 21' (cf. FIG. 3*b*). The voltage $V_-$ is applied to the inverting input of a second voltage comparator circuit 21" and is also compared with the reference voltage REF in order to detect the transitions of $V_-$. The output voltage $V_{S-}$ is present at the output of the voltage comparator 21" (cf. FIG. 3*c*).

When these two voltages $V_{S+}$ and $V_{S-}$ are obtained, it is advantageously possible to recover the clock signal by the use of a logic NAND circuit 22, whose two inputs receive $V_{S+}$ and $V_{S-}$, respectively, and to transform the message encoded in "return-to-zero" (RZ) into a message encoded in "non-return-to-zero" (NRZ), by means of a bistable trigger circuit 23 of the RS trigger type, for example, composed of two logic NAND circuits. The recovered clock signal lHR and the transformed message IR are represented in FIGS. 3*d* and 3*e*, respectively.

Such an circuit is of major importance as to its use for reception of data strictly observing the standard ARING 429-2.

What is claimed is:

1. A circuit for providing DC isolation between a pulse generator and a load comprising a primary circuit and a secondary circuit coupled to each other by mutual inductance, and including at least one magnetization current elimination circuit connected to the secondary circuit, further comprising at least one unidirectional transmission circuit which is connected between the pulse generator and the primary circuit, passing pulses of said generator and which opposes the discharge of magnetization currents, whereby said magnetization current is dissipated rapidly and solely through the secondary circuit, and a circuit in series with said unidirectional transmission circuit for attenuating transient currents due to commutations.

2. The circuit as claimed in claim 1, wherein the unidirectional transmission circuit is constituted by a diode connected in series with the primary circuit.

3. The circuit as claimed in claim 1, wherein the circuit for attenuating the transient phenomena due to commutation is constituted by a Zener diode connected in series with the unidirectional transmission circuit.

4. A circuit for providing DC isolation between a pulse generator and a load comprising:

a single source of bipolar pulses;

a primary magnetic circuit including first and second primary windings, and a secondary circuit including first and second secondary windings magnetically coupled to said primary magnetic circuit; each of said secondary windings connected to an individual load, and to an individual magnetizing current elimination circuit;

first and second unidirectional transmission circuits for coupling opposite polarity pulses to said first and second primary windings; and first and second attenuating circuits for reducing commutation transients in said first and second primary windings.

* * * * *